United States Patent
Satou et al.

(10) Patent No.: US 11,053,384 B2
(45) Date of Patent: Jul. 6, 2021

(54) CURABLE COMPOSITION AND CURED PRODUCT THEREOF

(71) Applicant: DIC Corporation, Tokyo (JP)

(72) Inventors: Yutaka Satou, Ichihara (JP); Akito Kawasaki, Ichihara (JP); Tatsuya Okamoto, Ichihara (JP)

(73) Assignee: DIC Corporation, Tokyo (JP)

( * ) Notice: Subject to any disclaimer, the term of this patent is extended or adjusted under 35 U.S.C. 154(b) by 76 days.

(21) Appl. No.: 16/313,244

(22) PCT Filed: Jun. 22, 2017

(86) PCT No.: PCT/JP2017/023001
§ 371 (c)(1),
(2) Date: Dec. 26, 2018

(87) PCT Pub. No.: WO2018/008415
PCT Pub. Date: Jan. 11, 2018

(65) Prior Publication Data
US 2019/0169424 A1 Jun. 6, 2019

(30) Foreign Application Priority Data

Jul. 6, 2016 (JP) .............................. JP2016-134227
Jul. 15, 2016 (JP) .............................. JP2016-140422

(51) Int. Cl.
| | | |
|---|---|---|
| *C08L 63/00* | (2006.01) | |
| *H05K 1/03* | (2006.01) | |
| *H01L 23/29* | (2006.01) | |
| *H01L 23/31* | (2006.01) | |
| *C08K 3/36* | (2006.01) | |
| *C08G 59/42* | (2006.01) | |
| *C08G 59/62* | (2006.01) | |
| *C09D 163/00* | (2006.01) | |
| *C08K 5/00* | (2006.01) | |
| *C08K 5/12* | (2006.01) | |

(52) U.S. Cl.
CPC .......... *C08L 63/00* (2013.01); *C08G 59/4223* (2013.01); *C08G 59/621* (2013.01); *C08K 3/36* (2013.01); *C09D 163/00* (2013.01); *H01L 23/29* (2013.01); *H01L 23/293* (2013.01); *H01L 23/31* (2013.01); *H05K 1/03* (2013.01); *H05K 1/0326* (2013.01); *C08K 5/0025* (2013.01); *C08K 5/12* (2013.01)

(58) Field of Classification Search
None
See application file for complete search history.

(56) References Cited

U.S. PATENT DOCUMENTS

2005/0003199 A1    1/2005 Takaya et al.

FOREIGN PATENT DOCUMENTS

| JP | 04-008444 B2 | 2/1992 |
|---|---|---|
| JP | 2002-012650 A | 1/2002 |
| JP | 2004-169021 A | 6/2004 |
| JP | 2004-210936 A | 7/2004 |
| JP | 2004-224890 A | 8/2004 |
| JP | 2013004719 A * | 6/2011 |

OTHER PUBLICATIONS

Machine translation of JP2013004719A Honda et al. p. 1-32 (Year: 2013).*
International Search Report dated Sep. 26, 2017, issued for PCT/JP2017/023001.

* cited by examiner

*Primary Examiner* — Robert T Butcher
(74) *Attorney, Agent, or Firm* — Locke Lord LLP

(57) ABSTRACT

Provided are a curable composition capable of both exhibiting a low shrinkage percentage during curing and forming a cured product having a low elastic modulus under high temperature conditions, a cured product of the curable composition, and a semiconductor encapsulating material and a printed wiring board which are produced using the curable composition. The curable composition includes an active ester compound (A) that is an esterification product of a phenolic compound (a1) and an aromatic polycarboxylic acid or an acid halide thereof (a2); and a curing agent. Also provided are a cured product of the curable composition, and a semiconductor encapsulating material and a printed wiring board which are produced using the curable composition.

9 Claims, No Drawings

CURABLE COMPOSITION AND CURED PRODUCT THEREOF

TECHNICAL FIELD

The present invention relates to a curable composition capable of both exhibiting a low shrinkage percentage during curing and forming a cured product having a low elastic modulus under high temperature conditions, and also relates to a cured product thereof, a semiconductor encapsulating material, and a printed wiring board.

BACKGROUND ART

In the technical field of insulating materials which are used in semiconductors, multi-layer printed boards, and the like, with a decrease in thickness and size of various electric members, development of new resin materials according to those market trends is demanded. As performance required in semiconductor encapsulating materials, a low elastic modulus at the time of heating is demanded in order to improve reflow properties. Further, reliability degradation caused by "warpage" of members due to a decrease in thickness of semiconductors in recent years becomes significant, and in order to suppress the reliability degradation, resin materials having a low curing shrinkage percentage are demanded.

As a resin material having a low elastic modulus at the time of heating in a cured product, an active ester resin, which is obtained by esterification of a dicyclopentadiene-phenolic resin and α-naphthol with phthalic acid chloride is exemplified (see PTL 1 below). When compared to the case of using a conventional curing agent such as a phenol novolac resin, the active ester resin described in PTL 1 exhibits a feature of a low elastic modulus at the time of heating because of its low cross-linking density; however, since the active ester resin does not satisfy the level required in recent years and has a high melt viscosity, the active ester resin cannot be applied to a semiconductor encapsulating material. In addition, the active ester resin has also a high curing shrinkage percentage feature.

CITATION LIST

Patent Literature

PTL 1: JP-A-2004-169021

SUMMARY OF INVENTION

Technical Problem

Therefore, an object of the present invention is to provide a curable composition capable of both exhibiting a low shrinkage percentage during curing and forming a cured product having a low elastic modulus under high temperature conditions, and to provide a cured product thereof, a semiconductor encapsulating material, and a printed wiring board.

Solution to Problem

The present inventors have conducted intensive studies in order to solve the above-described problems, and as a result, found that a curable composition containing an esterification product of a phenolic compound and an aromatic polycarboxylic acid or an acid halide thereof is capable of both exhibiting a low shrinkage percentage during curing and forming a cured product having a low elastic modulus under high temperature conditions, thereby completing the present invention.

Specifically, the present invention relates to a curable composition including: an active ester compound (A) that is an esterification product of a phenolic compound (a1) and an aromatic polycarboxylic acid or an acid halide thereof (a2); and a curing agent.

The present invention further relates to a cured product of the curable composition.

The present invention still further relates to a semiconductor encapsulating material including the curable composition.

The present invention still further relates to a printed wiring board including a product obtained using the curable composition.

Advantageous Effects of Invention

According to the present invention, it is possible to provide a curable composition capable of both exhibiting a low shrinkage percentage during curing and forming a cured product having a low elastic modulus under high temperature conditions, and to provide a cured product thereof, a semiconductor encapsulating material, and a printed wiring board.

DESCRIPTION OF EMBODIMENTS

Hereinafter, the present invention will be described in detail.

A curable composition of the present invention includes an active ester compound (A) that is an esterification product of a phenolic compound (a1) and an aromatic polycarboxylic acid or an acid halide thereof (a2); and a curing agent.

The specific structure of the active ester compound (A) is not particularly limited as long as it is an esterification product of the phenolic compound (a1) and the aromatic polycarboxylic acid or the acid halide thereof (a2). That is, existence and the number of the other substituents, the type of substituent, a substitution site, and the like are not limited as long as the phenolic compound (a1) is a compound having hydroxyl groups in a benzene ring form. Other than, the number of carboxyl groups or acid halide groups and a substitution site are arbitrary as long as the aromatic polycarboxylic acid or the acid halide thereof (a2) is a compound having a plurality of carboxyl groups or acid halide groups on an aromatic ring, and the aromatic ring may be any one of a benzene ring, a naphthalene ring, an anthracene ring, and the like. In addition, in the present invention, the active ester compound (A) may be used alone or in combination of two or more kinds thereof.

The phenolic compound (a1) may be, for example, phenol or a compound having an aromatic phenolic ring and having, on the aromatic phenolic ring, a substituent, such as an aliphatic hydrocarbon group such as a methyl group, an ethyl group, a vinyl group, a propyl group, a butyl group, a pentyl group, a hexyl group, a cyclohexyl group, a heptyl group, an octyl group, a nonyl group, a decyl group, an undecyl group, or a dodecyl group; an aryl group such as a phenyl group, a naphthyl group, or an anthryl group; an aralkyl group such as a phenyl methyl group, a phenyl ethyl group, a naphthyl methyl group, or a naphthyl ethyl group; an alkoxy group such as a methoxy group, an ethoxy group, a propyloxy group, or a butoxy group; or a halogen atom such as a fluorine atom, a chlorine atom, or a bromine atom. One or more phenolic compounds (a1) may be used alone or in combination.

Among them, from the viewpoint of obtaining a curable composition having both a low shrinkage percentage at the time of curing and a low elastic modulus under a high temperature condition in a cured product, phenol or a compound having a hydrocarbon group on an aromatic nucleus of phenol is preferable, and a compound having an aliphatic hydrocarbon group or an aryl group on an aromatic nucleus of phenol is more preferable. The number of carbon atoms of the aliphatic hydrocarbon group is preferably in the range of 1 to 12 and more preferably in the range of 1 to 6.

The specific structure of the aromatic polycarboxylic acid or the acid halide thereof (a2) is not particularly limited as long as it is an aromatic compound which may form an ester bond by reaction with a phenolic hydroxyl group of the phenolic compound (a1), and may be any compound. Specific examples thereof include benzene dicarboxylic acids such as isophthalic acid and terephthalic acid; benzenetricarboxylic acids such as trimellitic acid; naphthalene dicarboxylic acids such as naphthalene-1,4-dicarboxylic acid, naphthalene-2,3-dicarboxylic acid, naphthalene-2,6-dicarboxylic acid, and naphthalene-2,7-dicarboxylic acid; acid halides thereof; and compounds in which the aliphatic hydrocarbon group, the alkoxy group, the halogen atom, and the like are substituted on aromatic nuclei thereof. Examples of the acid halide include acid chloride, acid bromide, acid fluoride, and oxyiodide. These may be used alone, respectively, or in combination of two or more kinds thereof. Of them, from the viewpoint of obtaining a curable composition having high reaction activity and excellent curability, benzene dicarboxylic acids such as isophthalic acid and terephthalic acid or an acid halide thereof is preferable.

From the above description, as a preferable specific structure of the active ester compound (A), for example, the following Structural Formula (1) or the like is exemplified.

[Chem. 1]

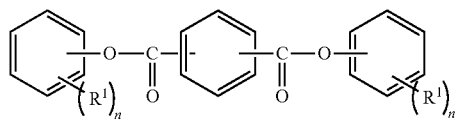

(1)

In the formula, R's each independently represent any one of an aliphatic hydrocarbon group, an aryl group, and an aralkyl group and may be bonded to any carbon atom on a benzene ring, and n is 0, 1, or 2.

The reaction of the phenolic compound (a1) and the aromatic polycarboxylic acid or the acid halide thereof (a2) can be performed, for example, by a method of heating and stirring in the presence of an alkali catalyst under the temperature condition of about 40 to 65° C. The reaction may be performed in an organic solvent as necessary. In addition, after the completion of the reaction, a reaction product may be purified by washing with water, reprecipitation, or the like, as desired.

Examples of the alkali catalyst include sodium hydroxide, potassium hydroxide, triethylamine, and pyridine. These may be used alone, respectively, or in combination of two or more kinds thereof. In addition, the alkali catalyst may be used as an aqueous solution of about 3.0 to 30%. Of them, sodium hydroxide or potassium hydroxide having high catalytic capacity is preferable.

Examples of the organic solvent include ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide; dimethylacetamide; and N-methylpyrrolidone. These may be used alone, respectively, or as a mixed solvent of two or more kinds thereof.

Since a target active ester compound (A) is obtainable at a high yield, the reaction proportion of the phenolic compound (a1) and the aromatic polycarboxylic acid or the acid halide thereof (a2) is preferably a proportion in which the phenolic compound (a1) is 0.95 to 1.05 mol with respect to 1 mol of the total of the carboxyl group or acid halide group of the aromatic polycarboxylic acid or the acid halide thereof (a2).

Regarding the melt viscosity of the active ester compound (A), a value at 175° C. which is measured according to ASTM D4287 using an ICI viscometer is preferably in the range of 0.001 to 5 dPa·s.

The curable composition of the present invention may contain another active ester compound or a resin (B) along with the active ester compound (A). Examples of the other active ester compound or the resin (B) include an active ester compound (B1) that is an esterification product of a naphthol compound (b1) and an aromatic polycarboxylic acid or an acid halide thereof (b2) and an active ester resin (B2) containing, as essential reaction raw materials, a compound having one phenolic hydroxyl group (b3), a compound having two or more phenolic hydroxyl groups (b4), and an aromatic polycarboxylic acid or an acid halide thereof (b5).

In the case of using the other active ester compound or the resin (B), from the viewpoint of obtaining a curable composition having both a low shrinkage percentage at the time of curing and a low elastic modulus under a high temperature condition in a cured product, the content ratio of the active ester compound (A) to the total of the active ester compound (A) and the other active ester compound or the resin (B) is preferably 45% by mass or more, more preferably in the range of 45 to 99% by mass, further preferably in the range of 50 to 99% by mass, and particularly preferably in the range of 65 to 99% by mass.

The curable composition of the present invention contains the aforementioned active ester compound (A) and a curing agent. The curing agent may be a compound which may react with the active ester compound (A), and various compounds can be used without particular limitation. As an example of the curing agent, for example, an epoxy resin is exemplified.

Examples of the epoxy resin include a phenol novolac type epoxy resin, a cresol novolac type epoxy resin, a naphthol novolac type epoxy resin, a bisphenol novolac type epoxy resin, a biphenol novolac type epoxy resin, a bisphenol type epoxy resin, a biphenyl type epoxy resin, a triphenol methane type epoxy resin, a tetraphenol ethane type epoxy resin, a dicyclopentadiene-phenol addition reaction type epoxy resin, a phenol aralkyl type epoxy resin, and a naphthol aralkyl type epoxy resin.

In the curable composition of the present invention, the mixing proportion of the active ester compound (A) and the curing agent is not particularly limited, and can be appropriately adjusted according to desired cured product performance and the like. For example, the mixing proportion in the case of using an epoxy resin as the curing agent is preferably a proportion in which the total of the functional group in the active ester compound (A) is 0.7 to 1.5 mol with respect to 1 mol of the total of the epoxy group in the curable composition.

The curable composition of the present invention may further contain another resin component. Examples of the other resin component include amine compounds such as diaminodiphenylmethane, diethylene triamine, triethylene tetramine, diaminodiphenylsulfone, isophorone diamine, imidazole, a $BF_3$-amine complex, and a guanidine derivative; amide compounds such as dicyandiamide and a polyamide resin synthesized by a linolenic acid dimer and ethylenediamine; acid anhydrides such as phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride; phenolic resins such as a phenol novolac resin, a cresol novolac resin, a naphthol novolac resin, a bisphenol novolac resin, a biphenyl novolac resin, a dicyclopentadiene-phenol adduct type resin, a phenol aralkyl resin, a naphthol aralkyl resin, a triphenol methane type resin, a tetraphenol ethane type resin, and an aminotriazine-modified phenolic resin; a cyanic acid ester resin; a bismaleimide resin; a benzoxazine resin; a styrene-maleic anhydride resin; an allyl group-containing resin typified by diallyl bisphenol or triallyl isocyanurate; and polyphosphoric acid ester or phosphoric acid ester-carbonate copolymer. These may be used alone, respectively, or in combination of two or more kinds thereof.

The mixing proportion of those other resin components is not particularly limited, and can be appropriately adjusted according to desired cured product performance and the like. As an example of the mixing proportion, the other resin component is used in the range of 1 to 50% by mass in the curable composition of the present invention.

The curable composition of the present invention may contain, as necessary, various additives such as a curing promoter, a flame retardant, an inorganic filler, a silane coupling agent, a release agent, a pigment, and an emulsifier.

Examples of the curing promoter include a phosphorus compound, tertiary amine, an imidazole compound, a pyridine compound, an organic acid metal salt, a Lewis acid, and an amine complex salt. Among them, from the viewpoint of being excellent in curability, heat resistance, electrical characteristics, moisture resistance reliability, and the like, triphenylphosphine as the phosphorus compound, 1,8-diazabicyclo-[5.4.0]-undecene (DBU) as the tertiary amine, 2-ethyl-4-methylimidazole as the imidazole compound, and 4-dimethylaminopyridine as the pyridine compound are preferable.

Examples of the flame retardant include inorganic phosphorus compounds such as red phosphorus, ammonium phosphates such as monoammonium phosphate, diammonium phosphate, triammonium phosphate, and ammonium polyphosphate, and amide phosphate; organic phosphorus compounds such as a phosphoric acid ester compound, a phosphonic acid compound, a phosphinic acid compound, a phosphine oxide compound, a phosphorane compound, an organic nitrogen-containing phosphorus compound, cyclic organic phosphorus compounds such as 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide, and derivatives obtained by reacting the cyclic organic phosphorus compounds with a compound such as an epoxy resin or a phenolic resin; nitrogen-based flame retardants such as a triazine compound, a cyanuric acid compound, an isocyanuric acid compound, and phenothiazine; silicone-based flame retardants such as silicone oil, silicone rubber, and a silicone resin; and inorganic flame retardants such as metal hydroxide, metal oxide, a metal carbonate compound, metal powder, a boron compound, and low melting point glass. In the case of using those flame retardants, the flame retardant is preferably used in the range of 0.1 to 20% by mass in the curable composition.

The inorganic filler is mixed, for example, in a case where the curable composition of the present invention is used for an application to a semiconductor encapsulating material. Examples of the inorganic filler include fused silica, crystalline silica, alumina, silicon nitride, and aluminum hydroxide. Of them, from the viewpoint that the inorganic filler can be mixed more, the fused silica is preferable. Although either crushed or spherical fused silica can be used, the spherical fused silica is preferably mainly used for increasing the amount of the fused silica mixed and suppressing an increase in melt viscosity of the curable composition. In order to further increase the amount of the spherical silica mixed, the grain size distribution of the spherical silica is preferably properly adjusted. The filling rate is preferably in the range of 0.5 to 95 parts by mass in 100 parts by mass of the curable composition.

Other than, in a case where the curable composition of the present invention is used for an application to a conductive paste or the like, a conductive filler such as silver powder or copper powder can be used.

As described above, the curable composition of the present invention has a feature that both the shrinkage percentage at the time of curing and the elastic modulus under a high temperature condition in a cured product are low. In addition, the curable composition has also sufficiently high general required performance, which is required for a resin material, such as high solubility to a general-purpose organic solvent, high heat resistance, high water absorption resistance, and a low melt viscosity, and can also be widely used for an application to a coating material, an adhesive, a molded product, or the like in addition to the application to an electronic material such as a printed wiring board, a semiconductor encapsulating material, or a resist material.

In a case where the curable composition of the present invention is used for an application to a printed wiring board or an application to an adhesive film for build-up, generally, the curable composition is preferably diluted by mixing an organic solvent and then used. Examples of the organic solvent include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. The type and mixed amount of the organic solvent can be appropriately adjusted according to usage environment of the curable composition, but for example, in an application to a printed circuit board, a polar solvent having a boiling point of 160° C. or lower, such as methyl ethyl ketone, acetone, or dimethylformamide, is preferable, and is preferably used at a nonvolatile content ratio of 40 to 80% by mass. In an application to an adhesive film for build-up, it is preferable to use ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide; dimethylacetamide; N-methylpyrrolidone; and the like. Such an organic solvent is preferably used at a nonvolatile content ratio of 30 to 60% by mass.

Further, as a method for producing a printed wiring board using the curable composition of the present invention, for example, a method is exemplified in which the curable composition is impregnated with a reinforcing substrate and then cured to obtain a prepreg, and a copper foil is pressure-bonded thereon under heating. Examples of the reinforcing substrate include paper, a glass cloth, a glass nonwoven fabric, aramid paper, an aramid cloth, a glass mat, and a glass roving cloth. The amount of the curable composition impregnated is not particularly limited, but generally, is preferably adjusted such that the resin content in the prepreg is 20 to 60% by mass.

In a case where the curable composition of the present invention is used for an application to a semiconductor encapsulating material, generally, an inorganic filler is preferably mixed. The semiconductor encapsulating material can be produced, for example, by mixing a mixture using an extruder, a kneader, a roll, or the like. As a method for molding a semiconductor package using the obtained semiconductor encapsulating material, for example, there is exemplified a method of casting the semiconductor encapsulating material or molding the semiconductor encapsulating material using a transfer molding machine, an injection molding machine, or the like and then heating the resultant product under a temperature condition of 50 to 200° C. for 2 to 10 hours, and a semiconductor device as a molded product can be obtained by such a method.

EXAMPLES

Next, the present invention will be described in more detail by way of Examples and Comparative Examples. The descriptions "part" and "%" in Examples are on the basis of the mass unless otherwise stated particularly.

Melt Viscosity Measurement Method

Regarding the melt viscosity of the active ester compound in this Example, the melt viscosity at 175° C. was measured according to ASTM D4287 using an ICI viscometer.

Production Example 1 Production of Active Ester Compound (A-1)

Into a flask equipped with a thermometer, a dropping funnel, a cooling pipe, a fractionating column, and a stirrer, 202.0 g of isophthalic acid chloride and 13000 g of toluene were charged, and the content was dissolved under reduced pressure in a system purged with nitrogen. Then, 300.0 g of p-tertiary butyl phenol was charged, and the content was dissolved under reduced pressure in a system purged with nitrogen. 0.64 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A-1). The melt viscosity of the active ester compound (A-1) was 0.05 dP·s.

Production Example 2 Production of Active Ester Compound (A-2)

Into a flask equipped with a thermometer, a dropping funnel, a cooling pipe, a fractionating column, and a stirrer, 202.0 g of isophthalic acid chloride and 1400 g of toluene were charged, and the content was dissolved under reduced pressure in a system purged with nitrogen. Then, 340.0 g of orthophenyl phenol was charged, and the content was dissolved under reduced pressure in a system purged with nitrogen. 0.70 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A-2). The melt viscosity of the active ester compound (A-2) was 0.07 dP·s.

Production Example 3 Production of Active Ester Compound (A-3)

Into a flask equipped with a thermometer, a dropping funnel, a cooling pipe, a fractionating column, and a stirrer, 202.0 g of isophthalic acid chloride and 1000 g of toluene were charged, and the content was dissolved under reduced pressure in a system purged with nitrogen. Then, 216.0 g of orthocresol was charged, and the content was dissolved under reduced pressure in a system purged with nitrogen. 0.50 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A-3). The melt viscosity of the active ester compound (A-3) was 0.03 dP·s.

Production Example 4 Production of Active Ester Compound (A-4)

Into a flask equipped with a thermometer, a dropping funnel, a cooling pipe, a fractionating column, and a stirrer, 202.0 g of isophthalic acid chloride and 1000 g of toluene were charged, and the content was dissolved under reduced pressure in a system purged with nitrogen. Then, 216.0 g of a mixture of metacresol and paracresol (m/p=67/33) was charged, and the content was dissolved under reduced pressure in a system purged with nitrogen. 0.50 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A-4). The melt viscosity of the active ester compound (A-4) was 0.03 dP·s.

Production Example 5 Production of Active Ester Compound (A-5)

Into a flask equipped with a thermometer, a dropping funnel, a cooling pipe, a fractionating column, and a stirrer, 202.0 g of isophthalic acid chloride and 1000 g of toluene were charged, and the content was dissolved under reduced pressure in a system purged with nitrogen. Then, 188.0 g of composition (1) was measured by the following manner. The results are presented in Table 1.

Measurement of Curing Shrinkage Percentage

The curable composition was injection-molded using a transfer molding machine ("KTS-15-1.5C" manufactured by Kohtaki Precision Machine Co., Ltd.) under the conditions of a mold temperature of 154° C., a molding pressure of 9.8 MPa, and a curing time of 600 seconds to obtain a molded product having a length of 110 mm, a width of 12.7 mm, and a thickness of 1.6 mm. Then, the obtained molded product was cured at 175° C. for 5 hours, and then left to stand at room temperature (25° C.) for 24 hours, and the resultant product was used as a test piece. The size in the longitudinal direction of the test piece at room temperature and the inner size in the longitudinal direction of the mold at 154° C. were respectively measured and the curing shrinkage percentage was calculated by the following equation.

Curing shrinkage percentage (%)={(the inner size in the longitudinal direction of the mold at 154° C.)−(the size in the longitudinal direction of the test piece at room temperature)}/(the inner size in the longitudinal direction of the mold at 154° C.)×100(%)

TABLE 1

|  | Example 1 | Example 2 | Example 3 | Example 4 | Example 5 | Comparative Example 1 |
|---|---|---|---|---|---|---|
| Active ester compound (A-1) [parts by mass] | 51.6 |  |  |  |  |  |
| Active ester compound (A-2) [parts by mass] |  | 53.8 |  |  |  |  |
| Active ester compound (A-3) [parts by mass] |  |  | 46.1 |  |  |  |
| Active ester compound (A-4) [parts by mass] |  |  |  | 46.1 |  |  |
| Active ester compound (A-5) [parts by mass] |  |  |  |  | 44.0 |  |
| Phenol novolac resin (*1) [parts by mass] |  |  |  |  |  | 66.0 |
| Epoxy resin (*2) [parts by mass] | 48.4 | 46.2 | 53.9 | 53.9 | 56.0 | 34.0 |
| Dimethylaminopyridine [parts by mass] | 1.0 | 1.0 | 1.0 | 1.0 | 1.0 | 1.0 |
| Fused silica [parts by mass] | 100.0 | 100.0 | 100.0 | 100.0 | 100.0 | 100.0 |
| Silane coupling agent [parts by mass] | 0.5 | 0.5 | 0.5 | 0.5 | 0.5 | 0.5 |
| Carnauba wax [parts by mass] | 0.7 | 0.7 | 0.7 | 0.7 | 0.7 | 0.7 |
| Curing shrinkage percentage [%] | 0.72 | 0.69 | 0.79 | 0.78 | 0.85 | 0.94 |

Phenol novolac resin (*1): "TD-2131" manufactured by DIC Corporation, hydroxyl equivalent of 104 g/eq
Epoxy resin (*2): a cresol novolac type epoxy resin ("N-655-EXP-S" manufactured by DIC Corporation, epoxy equivalent of 202 g/eq)

phenol was charged, and the content was dissolved under reduced pressure in a system purged with nitrogen. 0.50 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A-5). The melt viscosity of the active ester compound (A-5) was 0.02 dP·s.

Examples 1 to 5 and Comparative Example 1

Respective components were mixed at a ratio presented in the following Table 1 to obtain a curable composition (1). The curing shrinkage percentage of the obtained curable Examples 6 to 10 and Comparative Examples 2

Each set of components were mixed in the proportions shown in Table 2 below to form a curable composition (2). Using the obtained curable composition (2), a cured product was produced, and then the elastic modulus of the cured product was measured under high temperature conditions in the following manner. The results are presented in Table 2.

Measurement of Elastic Modulus of Cured Product Under High Temperature Conditions The curable composition was poured into a mold and molded at a temperature of 175° C. for 10 minutes using a pressing machine. The molded product was taken out from the mold and then cured at a temperature of 175° C. for 5 hours. The cured molded product was cut into a size of 5 mm×54 mm×2.4 mm, and the resultant product was used as a test piece.

The storage elastic modulus at 260° C. of the test piece was measured using a viscoelasticity measuring apparatus ("solid viscoelasticity measuring apparatus RSAII" manufactured by Rheometric Scientific Inc.) by a rectangular tension method under the conditions of a frequency of 1 Hz and a temperature raising rate of 3° C./min.

TABLE 2

|  | Example 6 | Example 7 | Example 8 | Example 9 | Example 10 | Comparative Example 2 |
|---|---|---|---|---|---|---|
| Active ester compound (A-1) [parts by mass] | 51.6 | | | | | |
| Active ester compound (A-2) [parts by mass] | | 53.8 | | | | |
| Active ester compound (A-3) [parts by mass] | | | 46.1 | | | |
| Active ester compound (A-4) [parts by mass] | | | | 46.1 | | |
| Active ester compound (A-5) [parts by mass] | | | | | 44.0 | |
| Phenol novolac resin (*1) [parts by mass] | | | | | | 66.0 |
| Epoxy resin (*2) [parts by mass] | 48.4 | 46.2 | 53.9 | 53.9 | 56.0 | 34.0 |
| Dimethylaminopyridine [parts by mass] | 1.0 | 1.0 | 1.0 | 1.0 | 1.0 | 1.0 |
| Storage elastic modulus at 260° C. [MPa] | 6.4 | 6.8 | 13.0 | 12.0 | 17.0 | 50.0 |

Phenol novolac resin (*1): "TD-2131" manufactured by DIC Corporation, hydroxyl equivalent of 104 g/eq
Epoxy resin (*2): a cresol novolac type epoxy resin ("N-655-EXP-S" manufactured by DIC Corporation, epoxy equivalent of 202 g/eq)

The invention claimed is:

1. A curable composition comprising:
an active ester compound (A) represented by the following Structural Formula (1):

[Chem. 1]

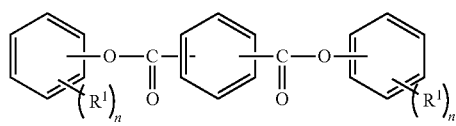

(1)

wherein $R^1$s each independently represent any one of an aliphatic hydrocarbon group, an aryl group, and an aralkyl group and may be bonded to any carbon atom on a benzene ring, and n is 1 or 2; and
a curing agent.

2. A cured product comprising a product obtained by curing the curable resin composition according to claim 1.

3. A semiconductor encapsulating material comprising the curable composition according to claim 1.

4. A printed wiring board comprising a product obtained using the curable composition according to claim 1.

5. The curable composition according to claim 1, wherein the curing agent is at least one epoxy resin selected from a phenol novolac type epoxy resin, a cresol novolac type epoxy resin, a naphthol novolac type epoxy resin, a bisphenol novolac type epoxy resin, a biphenol novolac type epoxy resin, a triphenol methane type epoxy resin, a tetraphenol ethane type epoxy resin, a dicyclopentadiene-phenol addition reaction type epoxy resin, a phenol aralkyl type epoxy resin, and a naphthol aralkyl type epoxy resin.

6. The curable composition according to claim 1, wherein $R^1$s each independently represent an aliphatic hydrocarbon group or an aryl group.

7. The curable composition according to claim 5, wherein $R^1$s each independently represent an aliphatic hydrocarbon group or an aryl group.

8. The curable composition according to claim 6, wherein the number of carbon atoms of the aliphatic hydrocarbon group is in the range of 4 to 12.

9. The curable composition according to claim 7, wherein the number of carbon atoms of the aliphatic hydrocarbon group is in the range of 4 to 12.

\* \* \* \* \*